US011158681B2

(12) United States Patent
Matsueda

(10) Patent No.: US 11,158,681 B2
(45) Date of Patent: Oct. 26, 2021

(54) OLED DISPLAY DEVICE AND METHOD OF MANUFACTURING OLED DISPLAY DEVICE

(71) Applicant: TIANMA JAPAN, LTD., Kanagawa (JP)

(72) Inventor: Yojiro Matsueda, Kanagawa (JP)

(73) Assignees: TIANMA JAPAN, LTD., Kanagawa (JP); Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 16/857,824

(22) Filed: Apr. 24, 2020

(65) Prior Publication Data
US 2020/0343319 A1    Oct. 29, 2020

(30) Foreign Application Priority Data
Apr. 26, 2019  (JP) .............................. JP2019-086147

(51) Int. Cl.
*H01L 27/32*  (2006.01)
*H01L 51/56*  (2006.01)

(52) U.S. Cl.
CPC ...... *H01L 27/3218* (2013.01); *H01L 27/3246* (2013.01); *H01L 27/3276* (2013.01); *H01L 51/56* (2013.01); *H01L 2227/323* (2013.01)

(58) Field of Classification Search
CPC ............. H01L 27/3276; H01L 27/3218; H01L 27/3246; H01L 27/326; H01L 51/56; H01L 2227/323
See application file for complete search history.

(56) References Cited

U.S. PATENT DOCUMENTS

| | | | |
|---|---|---|---|
| 2009/0128020 A1* | 5/2009 | Takei | H01L 27/3246 313/504 |
| 2010/0270912 A1* | 10/2010 | Ko | H01L 27/3211 313/504 |
| 2014/0197396 A1 | 7/2014 | Madigan | |
| 2017/0069694 A1* | 3/2017 | Ajiki | H01L 27/326 |
| 2017/0236883 A1* | 8/2017 | Madigan | H01L 51/5206 257/40 |
| 2018/0190736 A1* | 7/2018 | Kim | H01L 27/3246 |

* cited by examiner

*Primary Examiner* — Michael M Trinh
(74) *Attorney, Agent, or Firm* — Sughrue Mion, PLLC

(57) ABSTRACT

An OLED display device includes a substrate, subpixel lines on the substrate and an applied-material separation layer on the substrate. Each of the subpixel lines includes subpixels of the same color disposed along a first axis. The applied-material separation layer has application separation openings. Each of the application separation openings includes subpixels of the same color that are consecutive in one subpixel line. Within each application separation opening, organic light-emitting films of the subpixels of the same color are connected by an organic light-emitting film made of the same material as material of the organic light-emitting films of the subpixels. Banks between application separation openings in each of the subpixel lines are different in position from banks between application separation openings in an adjacent subpixel line when seen along a second axis perpendicular to the first axis.

9 Claims, 7 Drawing Sheets

OLED DISPLAY DEVICE AND METHOD OF MANUFACTURING OLED DISPLAY DEVICE

CROSS-REFERENCE TO RELATED APPLICATIONS

This Non-provisional application claims priority under 35 U.S.C. § 119(a) on Patent Application No. 2019-86147 filed in Japan on Apr. 26, 2019, the entire content of which is hereby incorporated by reference.

BACKGROUND

This disclosure relates to an organic light-emitting diode (OLED) display device and a method of manufacturing the OLED display device.

An OLED element is a current-driven self-light-emitting element and therefore, eliminates the necessity of backlight. In addition to this, the OLED element has advantages for achievement of low power consumption, wide viewing angle, and high contrast ratio; it is expected to contribute to development of flat panel display devices.

The display region of a color display device is generally composed of subpixels of the three primary colors of red (R), green (G), and blue (B). The subpixels are arrayed on the substrate of a display panel. Various arrangements of subpixels (pixel arrangements) have been proposed; for example, RGB stripe arrangement and delta-nabla arrangement (also simply referred to as delta arrangement) have been known.

The known methods of manufacturing OLED elements include a vapor deposition method that vapor-deposits an organic electroluminescent (EL) material onto a substrate and a printing method that applies an organic EL material dissolved in an organic solvent to a substrate by printing. In general, the organic EL material used in the vapor deposition method is low-molecular materials and the organic EL material used in the printing method is high-polymer materials.

The vapor deposition method requires metal masks to vapor-deposit different light-emitting materials onto a substrate and the utilization ratio of the materials is low. In contrast, the printing method does not require the masks; the utilization ratio of the organic EL material is high to allow for larger-area printing. However, the trend for higher-resolution OLED panels demands a smaller pitch between subpixels; the technique to reduce the risk of color mixture of ink is important.

One of the printing methods utilizes inkjet technology. The inkjet technology ejects droplets of ink from a nozzle to apply them to a substrate. Manufacturing an active matrix OLED display device utilizing the inkjet technology forms an insulative applied-material separation layer having a plurality of openings (bank openings) after forming a thin film transistor (TFT) array. In each bank opening, one or more electrodes for the same color of subpixel(s) are included. The inkjet method ejects ink into the bank opening. Hence, the applied-material separation layer prevents color mixture of ink.

SUMMARY

An aspect of this disclosure is an OLED display device, including: a substrate; a plurality of subpixel lines on the substrate, each of the plurality of subpixel lines including a plurality of subpixels of the same color disposed along a first axis; and an applied-material separation layer on the substrate, the applied-material separation layer having a plurality of application separation openings. Each of the plurality of application separation openings includes a plurality of subpixels of the same color that are consecutive in one subpixel line. Within each application separation opening, organic light-emitting films of the plurality of subpixels of the same color are connected by an organic light-emitting film made of the same material as material of the organic light-emitting films of the subpixels. Banks between application separation openings in each of the plurality of subpixel lines are different in position from banks between application separation openings in an adjacent subpixel line when seen along a second axis perpendicular to the first axis.

Another aspect of this disclosure is a method of manufacturing an OLED display device, including: forming a plurality of subpixel electrode lines on a substrate, each of the plurality of subpixel lines being composed of a plurality of subpixel electrodes disposed in a line along a first axis; forming an applied-material separation layer having a plurality of application separation openings, each of the plurality of application separation openings being formed to include a plurality of subpixel electrodes; and ejecting organic EL ink into each of the plurality of application separation openings. In forming the applied-material separation layer, banks between application separation openings in each of the plurality of subpixel electrode lines are different in position from banks between application separation openings in an adjacent subpixel electrode line when seen along a second axis perpendicular to the first axis.

It is to be understood that both the foregoing general description and the following detailed description are exemplary and explanatory and are not restrictive of this disclosure.

EMBODIMENTS

Figure 1:
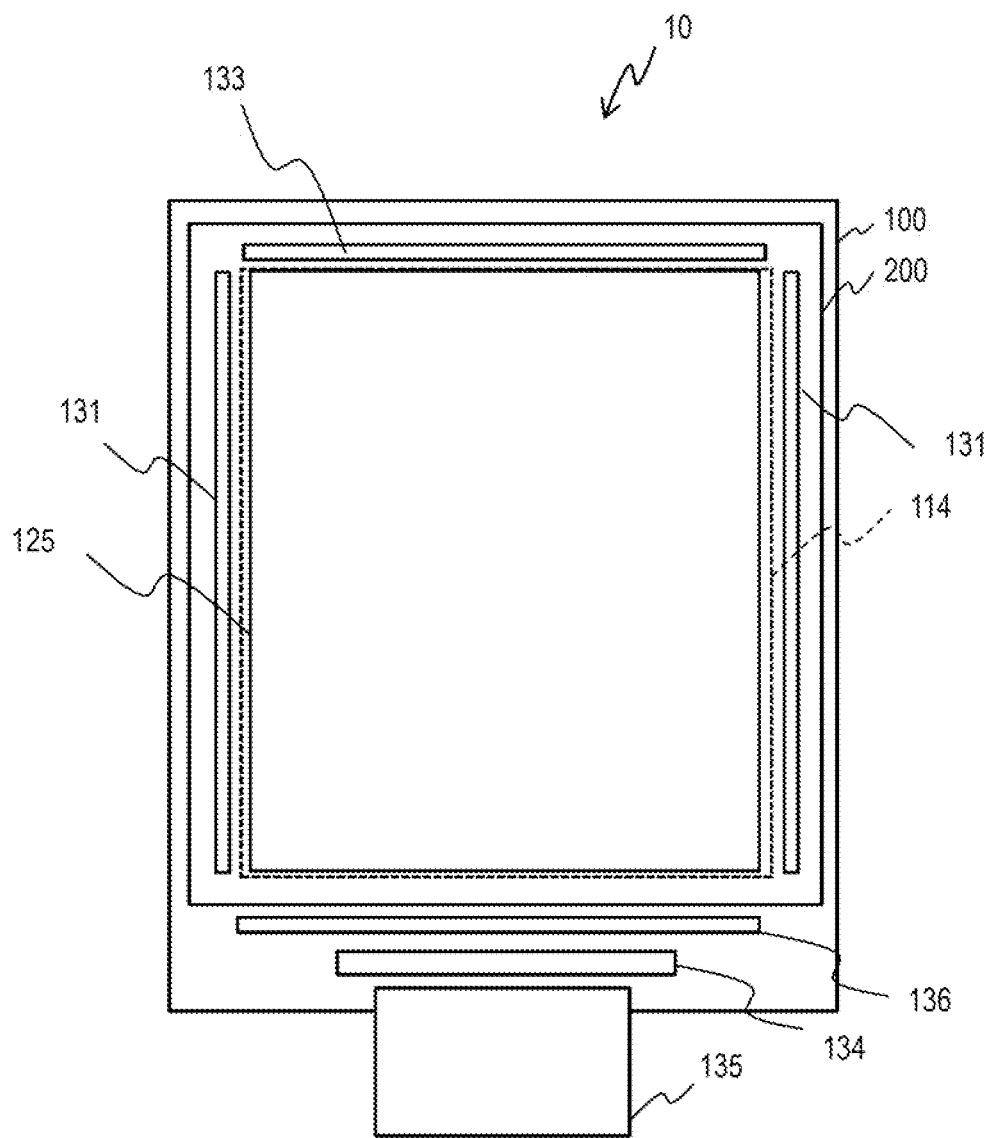
FIG. 1 schematically illustrates a configuration example of an OLED display device.

Hereinafter, embodiments of this disclosure are described with reference to the accompanying drawings. It should be noted that the embodiments are merely examples to implement this disclosure and not to limit the technical scope of this disclosure. For clear understanding of the description, some elements in the drawings are exaggerated in size or shape.

The organic light-emitting diode (OLED) display device in this disclosure includes an applied-material separation layer having a plurality of openings. In each opening, a plurality of OLED elements (subpixels) of the same color are formed. Organic EL material for one color is applied in each opening. The confines between the openings of the applied-material separation layer are disposed to be staggered. This arrangement reduces the unevenness of luminance to be perceived on the OLED display device.

Overall Configuration

FIG. 1 schematically illustrates a configuration example of an OLED display device 10. The OLED display device 10 includes a thin film transistor (TFT) substrate 100 on which OLED elements (organic light-emitting elements) are formed and a structural encapsulation unit 200 for encapsulating the OLED elements.

In the periphery of a cathode electrode forming region 114 outer than the display region 125 of the TFT substrate 100, scanning drivers 131, a protection circuit 133, a driver IC 134, and a demultiplexer 136 are provided. The driver IC 134 is connected to the external devices via flexible printed circuits (FPC) 135. The scanning drivers 131 drive scanning lines on the TFT substrate 100. The protection circuit 133 protects the elements from electrostatic discharge. The driver IC 134 is mounted with an anisotropic conductive film (ACF), for example.

The driver IC 134 provides power and timing signals (control signals) to the scanning drivers 131 and further, provides power and a data signal to the demultiplexer 136. The demultiplexer 136 serially outputs output of one pin of the driver IC 134 to d data lines (d is an integer more than 1). The demultiplexer 136 changes the output data line for the data signal from the driver IC 134 *d* times per scanning period to drive d times as many data lines as output pins of the driver IC 134.

Pixel Circuit

Figure 2A:
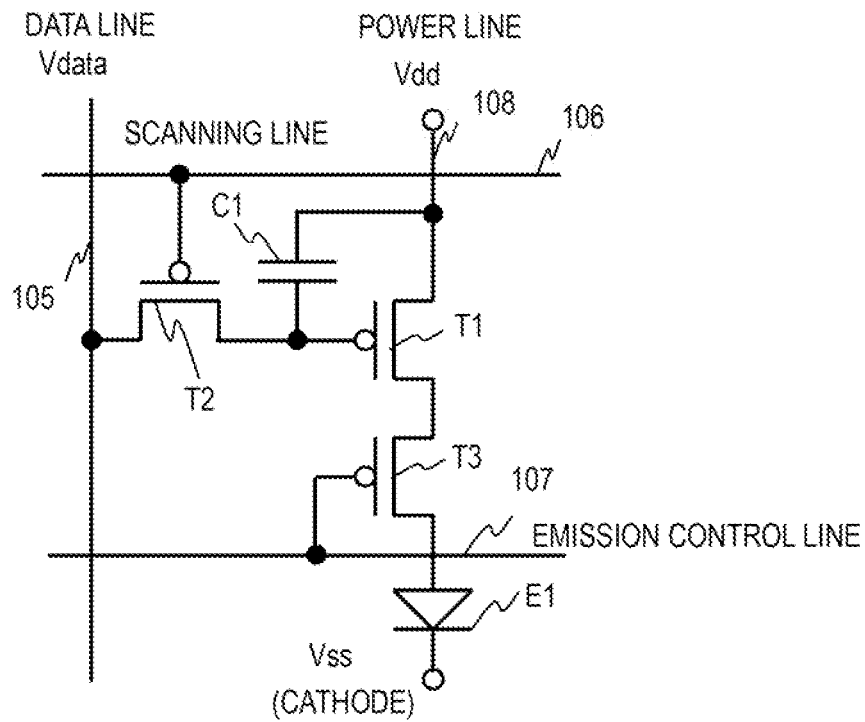
FIG. 2A illustrates a configuration example of a pixel circuit.

A plurality of pixel circuits are formed on the TFT substrate 100 to control electric current to be supplied to the anode electrodes (subpixel electrodes) of subpixels. FIG. 2A illustrates a configuration example of a pixel circuit. Each pixel circuit includes a driving transistor T1, a selection transistor T2, an emission transistor T3, and a storage capacitor C1. The pixel circuit controls light emission of an OLED element E1. The transistors are TFTs.

The selection transistor T2 is a switch for selecting the subpixel. The selection transistor T2 in FIG. 2A is a p-channel TFT and its gate terminal is connected with a scanning line 106. The source terminal of the selection transistor T2 is connected with a data line 105. The drain terminal of the selection transistor T2 is connected with the gate terminal of the driving transistor T1.

The driving transistor T1 is a transistor (driving TFT) for driving the OLED element E1. The driving transistor T1 in FIG. 2A is a p-channel TFT and its gate terminal is connected with the drain terminal of the selection transistor T2. The source terminal of the driving transistor T1 is connected with a power line (Vdd) 108. The drain terminal of the driving transistor T1 is connected with the source terminal of the emission transistor T3. The storage capacitor C1 is provided between the gate terminal and the source terminal of the driving transistor T1.

The emission transistor T3 is a switch for controlling supply/stop of the driving current to the OLED element E1. The emission transistor T3 in FIG. 2A is a p-channel TFT and its gate terminal is connected with an emission control line 107. The source terminal of the emission transistor T3 is connected with the drain terminal of the driving transistor T1. The drain terminal of the emission transistor T3 is connected with the OLED element E1.

Next, operation of the pixel circuit is described. The scanning driver 131 outputs a selection pulse to the scanning line 106 to turn on the transistor T2. The data voltage supplied from the driver IC 134 through the data line 105 is stored to the storage capacitor C1. The storage capacitor C1 holds the stored voltage during the period of one frame. The conductance of the driving transistor T1 changes in an analog manner in accordance with the stored voltage, so that the driving transistor T1 supplies a forward bias current corresponding to a light emission level to the OLED element E1.

The emission transistor T3 is located on the supply path of the driving current. The driver IC 134 outputs a control signal to the emission control line 107 to control ON/OFF of the emission transistor T3. When the emission transistor T3 is ON, the driving current is supplied to the OLED element E1. When the emission transistor T3 is OFF, this supply is stopped. The lighting period (duty ratio) in the period of one frame can be controlled by controlling ON/OFF of the transistor T3.

Figure 2B:
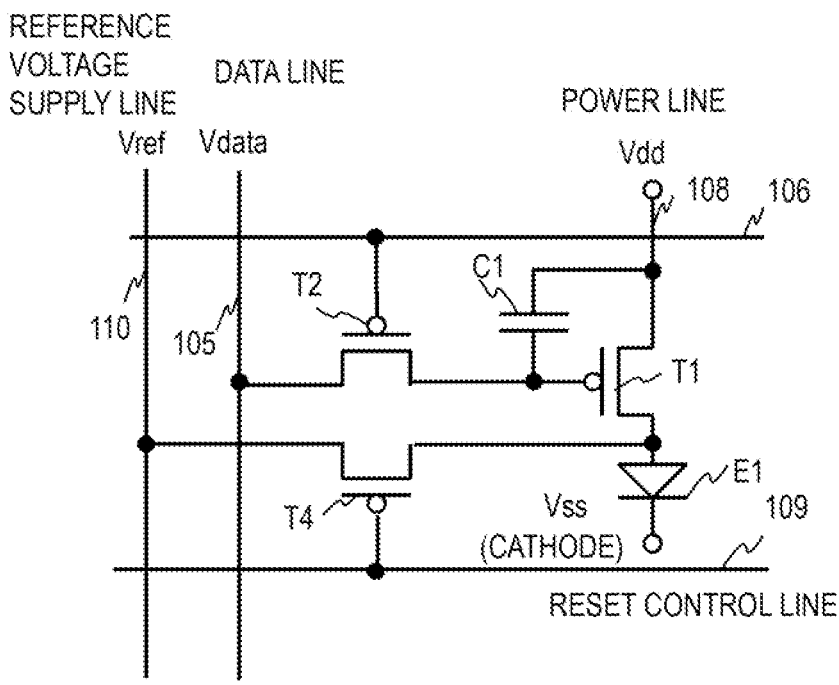
FIG. 2B illustrates another configuration example of a pixel circuit.

FIG. 2B illustrates another configuration example of a pixel circuit. This pixel circuit includes a reset transistor T4 in place of the emission transistor T3 in FIG. 2A. The reset transistor T4 controls the electric connection between a reference voltage supply line 110 and the anode of the OLED element E1. This control is performed in accordance with a reset control signal supplied to the gate of the reset transistor T4 through a reset control line 109.

The reset transistor T4 can be used for various purposes. For example, the reset transistor T4 can be used to reset the anode electrode of the OLED element E1 once to a sufficiently low voltage that is lower than the black signal level to prevent crosstalk caused by leak current between OLED elements E1.

The reset transistor T4 can also be used to measure a characteristic of the driving transistor T1. For example, the voltage-current characteristic of the driving transistor T1 can be accurately measured by measuring the current flowing from the power line (Vdd) 108 to the reference voltage supply line (Vref) 110 under the bias conditions selected so that the driving transistor T1 will operate in the saturated region and the reset transistor T4 will operate in the linear region. If the differences in voltage-current characteristic among the driving transistors T1 for individual subpixels are compensated for by generating data signals at an external circuit, a highly-uniform display image can be attained.

In the meanwhile, the voltage-current characteristic of the OLED element E1 can be accurately measured by applying a voltage to light the OLED element E1 from the reference voltage supply line 110 when the driving transistor T1 is off and the reset transistor T4 is operating in the linear region. In the case where the OLED element E1 is deteriorated because of long-term use, for example, if the deterioration is compensated for by generating a data signal at an external circuit, the display device can have a long life spun.

The circuit configurations in FIGS. 2A and 2B are examples; the pixel circuit may have a different circuit configuration. Although the pixel circuits in FIGS. 2A and 2B include p-channel TFTs, the pixel circuit may employ n-channel TFTs.

Pixel Structure

Figure 3:
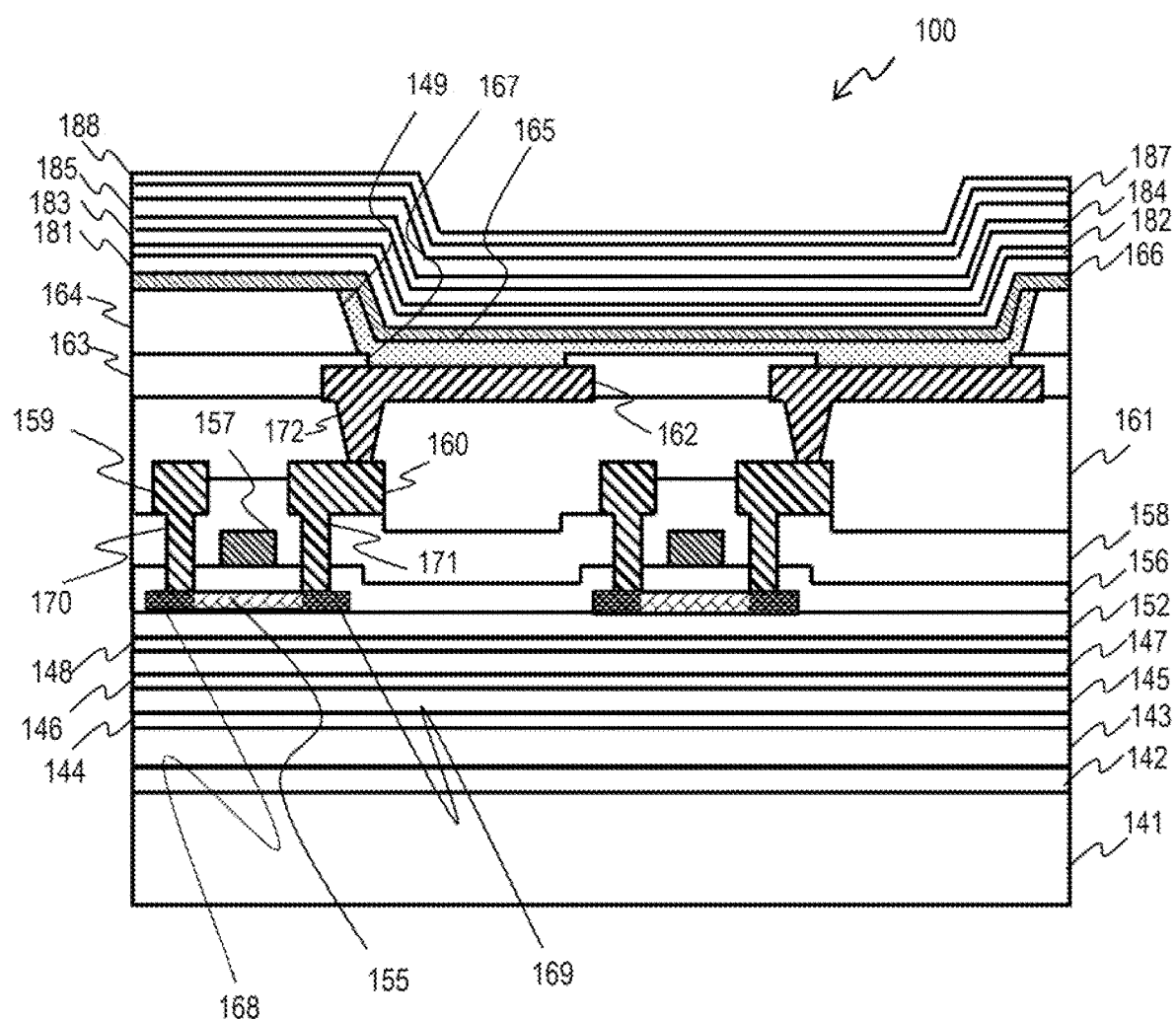
FIG. 3 schematically illustrates a cross-sectional structure of a part including driving TFTs of an OLED display device.

Next, general structures of a pixel circuit and a light-emitting element are described. FIG. 3 schematically illustrates a cross-sectional structure of a part including driving TFTs of an OLED display device 10. The OLED display device 10 includes a TFT substrate 100 and a structural encapsulation unit 200 opposed to the TFT substrate 100. In the following description, the definitions of top and bottom correspond to the top and the bottom of the drawing.

FIG. 3 illustrates a flexible OLED panel before being released from a support substrate 141. The OLED display device 10 includes an OLED panel and a driver IC 134. The OLED panel includes the TFT substrate 100 and the structural encapsulation unit 200. During the manufacturing process, the OLED panel is bonded by a release layer 142 with a glass support substrate 141. After the process is completed, the support substrate 141 is physically or chemically separated from the release layer 142.

The OLED display device (OLED panel) 10 includes an insulative flexible substrate 143 and a structural encapsulation unit opposed to the flexible substrate 143. An example of the structural encapsulation unit is a flexible or inflexible encapsulation substrate. The structural encapsulation unit can also be a thin film encapsulation (TFE) structure. FIG. 3 illustrates an example of the TFE structure.

The flexible substrate 143 is made of polyimide, for example. A multi-layer film formed by laminating inorganic thin film layers 144, 146, and 148 and organic thin film layers 145 and 147 alternately is provided between the flexible substrate 143 and the base film 152 of the TFT array. The inorganic thin film layers 144, 146, and 148 are to prevent permeation of moisture or oxygen; typically, they are made of silicon nitride or alumina. The organic thin film layers 145 and 147 are to prevent damage or to work as buffers against bending.

The OLED display device 10 includes lower electrodes (for example, anode electrodes 162), upper electrodes (for example, cathode electrodes 166), and organic light-emitting films (organic EL devices) 165 disposed between the flexible substrate 143 and the structural encapsulation unit.

The organic light-emitting films 165 are provided between the cathode electrodes 166 and the anode electrodes 162. A typical organic light-emitting film 165 is a multi-layer organic film and includes a hole injection layer, a hole transport layer, a light-emitting layer, an electron transport layer, and an electron injection layer, for example. The layers except for the light-emitting layer are optional. The plurality of anode electrodes 162 are disposed on the same plane (for example, on a planarization film 161) and an organic light-emitting film 165 is disposed on an anode electrode 162. In the example of FIG. 3, the cathode electrode 166 of one subpixel is a part of an unseparated conductor film.

The OLED display device 10 further includes a plurality of pixel circuits each including a plurality of transistors. Each of the plurality of pixel circuits is formed between the flexible substrate 143 and an anode electrode 162 and controls the electric current to be supplied to the anode electrode 162.

FIG. 3 illustrates an example of a top-emission pixel structure, which includes top-emission type of OLED elements. The top-emission pixel structure is configured in such a manner that a cathode electrode 166 common to a plurality of pixels is provided on the light emission side (the upper side of the drawing). The cathode electrode 166 has a shape that fully covers the entire display region 125. The top-emission pixel structure is characterized by that the anode electrodes 162 have light reflectivity and the cathode electrode 166 has light transmissivity. Hence, a configuration to transmit light coming from the organic light-emitting films 165 toward the structural encapsulation unit is attained.

Compared to a bottom-emission pixel structure configured to extract light from the flexible substrate 143, the top-emission type does not need a light transmissive region within a pixel region to extract light. For this reason, the top-emission type has high flexibility in laying out pixel circuits. For example, the light-emitting unit can be provided above the pixel circuits or lines. The bottom-emission pixel structure has a transparent anode electrode and a reflective cathode electrode to transmit light to the external through the flexible substrate 143. The features of this disclosure are also applicable to the bottom-emission pixel structure.

A subpixel of a full-color OLED display device usually displays one of the colors of red, green, and blue. A red subpixel, a green subpixel, and a blue subpixel constitute one main pixel. A pixel circuit including a plurality of transistors controls light emission of an OLED element associated therewith. An OLED element is composed of an anode electrode, an organic light-emitting film, and a cathode electrode.

A poly-silicon layer is provided above the base film 152. The poly-silicon layer includes channels 155 at the locations where gate electrodes 157 are to be formed later. At both ends of each channel 155, a source region 168 and a drain region 169 are provided. The source region 168 and the drain region 169 are doped with high-concentration impurities for electrical connection with a wiring layer thereabove.

Regions doped with low-concentration impurities can be provided between the channel 155 and the source region 168 and between the channel 155 and the drain region 169. These regions are omitted in FIG. 3. Above the poly-silicon layer, gate electrodes 157 are provided with a gate insulating film 156 interposed therebetween. An interlayer insulating film 158 is provided above the layer of the gate electrodes 157.

Within the display region 125, source electrodes 159 and drain electrodes 160 are provided above the interlayer insulating film 158. The source electrodes 159 and the drain electrodes 160 are formed of a metal having a high melting point or an alloy of such a metal. Each source electrode 159 and each drain electrode 160 are connected with a source region 168 and a drain region 169 of the poly-silicon layer through contact holes 170 and 171 provided in the interlayer insulating film 158 and the gate insulating film 156.

Over the source electrodes 159 and the drain electrodes 160, an insulative planarization film 161 is provided. Above the insulative planarization film 161, anode electrodes 162 are provided. Each anode electrode 162 is connected with a drain electrode 160 through a contact provided in a contact hole 172 in the planarization film 161. The TFTs of a pixel circuit are formed below the anode electrode 162.

Above the anode electrodes 162, an insulative pixel defining layer (PDL) 163 is provided to separate OLED elements. The pixel defining layer 163 is made of an insulative material that tend not to repel (having high wettability to) an ink (organic EL ink) including organic EL material. For example, the pixel defining layer 163 is made of silicon nitride. The organic EL ink includes an organic EL material and a solvent. The pixel defining layer 163 has an opening pattern including a plurality of openings (PDL openings) 167. The bottom of an PDL opening 167 is an anode electrode 162 and each OLED element is formed in an PDL opening 167 of the pixel defining layer 163. The shape of the PDL opening 167 corresponds to the shape of a subpixel (the light-emitting region thereof).

An insulative applied-material separation layer 164 for separating organic EL ink is provided above the pixel defining layer 163. The applied-material separation layer 164 is made of an insulative material that tend to repel (having low wettability to) the organic EL ink. For example, the applied-material separation layer 164 is made of photosensitive resin. The applied-material separation layer 164 is thicker than the pixel defining layer 163. The applied-material separation layer 164 has an opening pattern including a plurality of openings (application separation openings) 149. The insulating region between application separation openings 149 is referred to as bank. Each bank is a part of the applied-material separation layer 164. Each application separation opening 149 is surrounded and separated by banks.

A plurality of the same color of OLED elements (subpixels) are provided in each application separation opening 149. In other words, a plurality of PDL openings 167 are disposed in each application separation opening 149. In the example of FIG. 3, two OLED elements are provided in one application separation opening 149. As will be described later, manufacturing an OLED panel ejects droplets of organic EL ink into each application separation opening 149 to store the organic EL ink in the application separation opening 149. The quantity of the organic EL ink to be ejected to the application separation opening 149 is controlled so that the organic EL ink will not spill out from the application separation opening 149.

The inner wall of the application separation opening 149 is set back from the PDL openings 167. Accordingly, the pixel defining layer 163 is partially exposed between the inner wall of the application separation opening 149 and a PDL opening 167. As described above, the pixel defining layer 163 has high wettability to the organic EL ink and the applied-material separation layer 164 has low wettability to the organic EL ink. For this reason, the organic EL ink spreads out within the application separation opening 149 so that the entire surface of the anode electrode 162 is coated with the organic EL ink without any part left out.

The solvent of the organic EL ink dries and vaporizes to form an organic light emitting film 165. In the case of an organic light-emitting film 165 composed of a plurality of layers, the light-emitting layer is formed by inkjet method and the other layers are formed by vapor deposition or inkjet method.

Since each application separation opening 149 is separated from the other application separation openings 149 by banks, color mixture of the organic EL ink is prevented. Furthermore, the low wettability of the applied-material separation layer 164 to the organic EL ink more effectively prevents the color mixture of the organic EL ink. The wettability of the pixel defining layer 163 and the applied-material separation layer 164 does not need to be as described above, if permitted by design.

Above each anode electrode 162, an organic light-emitting film 165 is provided. The organic light-emitting film 165 is provided in an application separation opening 149 and is in contact with the pixel defining layer 163 and the inner wall of the application separation opening 149. A cathode electrode 166 is provided over the organic light-emitting film 165. The cathode electrode 166 is a light-transmissive electrode. The cathode electrode 166 transmits part of the visible light coming from the organic light-emitting film 165. The laminated film of the anode electrode 162, the organic light-emitting film 165, and the cathode electrode 166 formed in an PDL opening 167 of the pixel defining layer 163 corresponds to an OLED element.

A structural encapsulation unit is provided above the cathode electrode 166. The structural encapsulation unit is a multi-layer film formed by laminating inorganic thin film layers 182 and 184 and organic thin film layers 181, 183, and 185 alternately. The inorganic thin film layers 182 and 184 are to prevent permeation of moisture or oxygen and typically, they are made of silicon nitride or aluminum. The organic thin film layers 181, 183, and 185 are to prevent damage or to work as buffers against bending. A $\lambda/4$ plate 187 and a polarizing plate 188 are provided over the light emission surface (top face) of the structural encapsulation unit to prevent reflection of light entering from the external.

Manufacturing Method

An example of the method of manufacturing the OLED display device 10 is described. The method first prepares a support substrate 141 on which a release layer 142 and a flexible substrate 143 thereabove are provided. Next, the method forms a multi-layer film including inorganic thin film layers 144, 146, and 148 and organic thin film layers 145 and 147 laminated alternately. For example, the inorganic thin film layers are formed by depositing silicon nitride by chemical vapor deposition (CVD) and the organic thin film layers are formed by depositing photosensitive resin.

Next, the method deposits silicon nitride by chemical vapor deposition (CVD) or deposits photosensitive resin to form a base film 152. Next, the method forms a layer (poly-silicon layer) including channels 155 by a known low-temperature poly-silicon TFT fabrication technique. Specifically, the method forms the poly-silicon layer by depositing amorphous silicon by CVD and crystallizing the amorphous silicon by excimer laser annealing (ELA). The method processes the poly-silicon film to have island-like shapes and dopes the source and drain regions 168 and 169 to be connected with source electrodes 159 and drain electrodes 160 with impurities in high concentration to reduce the resistance. The poly-silicon layer reduced in resistance can also be used to connect elements within the display region 125.

Next, the method deposits silicon oxide, for example, onto the poly-silicon layer including the channels 155 by CVD to form a gate insulating film 156. Furthermore, the method deposits a metal by sputtering and patterns the metal to form a metal layer including gate electrodes 157.

The metal layer includes storage capacitor electrodes, scanning lines 106, and emission control lines, in addition to the gate electrodes 157. The metal layer may be a single layer made of one material selected from a group consisting of Mo, W, Nb, MoW, MoNb, Al, Nd, Ti, Cu, a Cu alloy, an Al alloy, Ag, and an Ag alloy. Alternatively, the metal layer may have a multi-layer structure to reduce the wiring resistance. The multi-layer structure can include two or more layers each made of the same or different low-resistive material selected from Mo, Cu, Al, and Ag.

In forming the metal layer, the method keeps offset regions to the gate electrodes 157 in the source and drain regions 168 and 169. Subsequently, the method dopes the poly-silicon film with additional impurities using the gate electrodes 157 as a mask to provide a layer of low-concentration impurities between the source regions 168 and the channels 155 and between the drain regions 169 and the channels 155.

Next, the method deposits silicon oxide by CVD to form an interlayer insulating film 158. The method opens contact holes in the interlayer insulating film 158 and the gate insulating film 156 by anisotropic etching. The contact holes 170 and 171 to connect the source electrodes 159 and the drain electrodes 160 to the source regions 168 and the drain regions 169, respectively, are formed in the interlayer insulating film 158 and the gate insulating film 156.

Next, the method deposits conductive materials by sputtering into a laminated film of Ti/Al/Ti, for example, and patterns the conductive laminated film to form a metal layer. The metal layer includes source electrodes 159, drain electrodes 160, and inner walls of the contact holes 170 and 171. In addition to these, data lines 105 and power lines 108 are also formed in the same metal layer.

Next, the method deposits a photosensitive organic material to form a planarization film 161. Subsequently, the method opens contact holes 172 connecting to the source electrodes 159 and the drain electrodes 160 of the TFTs by exposure and development. The method forms anode electrodes 162 on the planarization film 161 having contact holes 172. The pattern of the anode electrodes 162 corresponds to the pattern of subpixels; anode electrode lines each corresponding to a subpixel line are formed.

An anode electrode 162 includes three layers of a transparent film made of ITO, IZO, ZnO, $In_2O_3$, or the like, a reflective film made of a metal such as Ag, Mg, Al, Pt, Pd, Au, Ni, Nd, Ir, or Cr or an alloy containing such a metal, and another transparent film as mentioned above. The three-layer structure of the anode electrode 162 is merely an example and the anode electrode 162 may have a two-layer structure. The anode electrodes 162 are connected to the drain electrodes 160 through the contact holes 172.

Next, the method deposits silicon oxide by CVD and patterns the film to form a pixel defining layer 163. The patterning creates a plurality of PDL openings 167 (PDL opening patterns) in the pixel defining layer 163. The anode electrodes 162 of the subpixels are exposed at the bottom of the created PDL openings 167. The light-emitting region of each subpixel is isolated by the pixel defining layer 163.

Next, the method deposits photosensitive organic resin by spin coating and patterns the photosensitive organic resin to form a applied-material separation layer 164. The patterning creates a plurality of application separation openings 149 (application separation opening patterns) in the applied-material separation layer 164. A plurality of PDL openings 167 for the same color of subpixels are included in each application separation opening 149.

Next, the method applies organic EL ink to the inside of each application separation opening 149. An example of the method ejects droplets of the organic EL ink into the application separation opening 149 by inkjet printing. For example, the method ejects a predetermined number of droplets of the same color of organic EL ink into each PDL opening 167 in an application separation opening 149. The solvent in the organic EL ink dries to leave an organic light-emitting film 165. The method forms organic light-emitting films 165 for the colors of R, G, and B on the anode electrodes 162.

The light-emitting film 165 can be laminated with other layers into a multi-layer film. For example, a hole injection layer and a hole transport layer can be provided on the anode electrode side of the organic light-emitting film 165 and an electron transport layer and an electron injection layer can be provided on the cathode electrode side. The layers except for the organic light-emitting layer (light-emitting layer) 165 can be formed by inkjet method or vapor deposition. The laminate structure of the organic EL element is determined by design.

Next, the method deposits a metallic material for the cathode electrode 166 onto the substrate where the applied-material separation layer 164, and the organic light-emitting films 165 (in the openings of the applied-material separation layer 164) are exposed. The metallic material deposited on the organic light-emitting film 165 of one subpixel functions as the cathode electrode 166 of the subpixel within the region of an opening of the pixel defining layer 163.

The layer of the cathode electrode 166 is formed by vapor-deposition of a metal such as Al or Mg or an alloy thereof, for example. If the resistance of the cathode electrode 166 is so high to impair the uniformity of the luminance of the emitted light, an additional auxiliary electrode layer may be formed using a material for a transparent electrode, such as ITO, IZO, ZnO, or $In_2O_3$.

Next, the method forms a multi-layer film (structural encapsulation unit) including organic thin film layers 181, 183, and 185 and inorganic thin film layers 182 and 184 laminated alternately. For example, the inorganic thin film layers are formed by depositing silicon nitride by chemical vapor deposition (CVD) and the organic thin film layers are formed by depositing photosensitive resin. Further, the method forms a $\lambda/4$ plate 187 and a polarizing plate 188 on the structural encapsulation unit.

Subpixel Disposition in Delta-Nabla Panel

Figure 4:
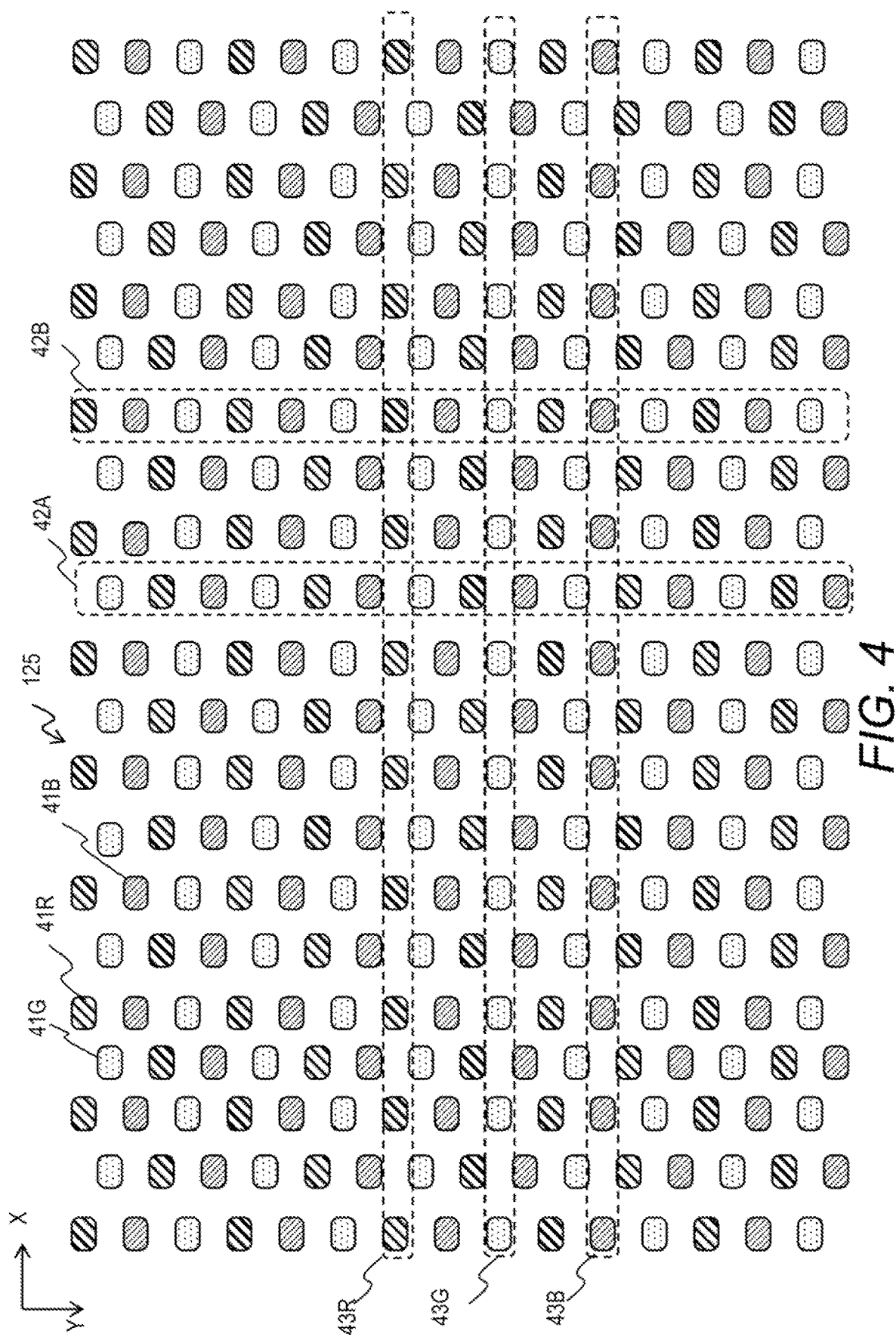
FIG. 4 schematically illustrates subpixels in a delta-nabla arrangement.

FIG. 4 schematically illustrates subpixels in a delta-nabla arrangement. The display region 125 is composed of a plurality of red subpixels 41R, a plurality of green subpixels 41G, and a plurality of blue subpixels 41B disposed in a plane. In FIG. 4, one of the red subpixels, one of the green subpixels, and one of the blue subpixels are provided with reference signs by way of example. The rounded rectangles identically hatched in FIG. 4 represent subpixels of the same color. Although the subpixels in FIG. 4 have rectangular shapes, subpixels may have desired shapes, such as hexagonal or octagonal shapes.

The display region 125 includes a plurality of subpixel rows extending along the X-axis (the first axis) and disposed one above another along the Y-axis (the second axis). In FIG. 4, one of the red subpixel rows is provided with a reference sign 43R, one of the green subpixel rows is provided with a reference sign 43G, and one of the blue subpixel rows is provided with a reference sign 43B, by way of example.

The X-axis and the Y-axis are perpendicular to each other within the plane where the subpixels are disposed. The X-direction is one of the two opposite directions along the X-axis and is directed from the left to the right of FIG. 4. The Y-direction is one of the two opposite directions along the Y-axis and is directed from the top to the bottom of FIG. 4.

In the example of FIG. 4, each subpixel row is composed of subpixels of the same color disposed at a predetermined pitch. Specifically, each subpixel row 43R is composed of red subpixels 41R disposed along the X-axis; each subpixel row 43G is composed of green subpixels 41G disposed along the X-axis; and each subpixel row 43B is composed of blue subpixels 41B disposed along the X-axis. The red subpixel rows 43R, green subpixel rows 43G, and blue subpixel rows 43B are cyclically disposed along the Y-axis.

That is to say, a subpixel row is sandwiched between subpixel rows of the other two colors. For example, a green subpixel row 43G is disposed between a red subpixel row 43R and a blue subpixel row 43B. In the example of FIG. 4, a red subpixel row 43R, a green subpixel row 43G, and a blue subpixel row 43B are disposed in this order and this cycle is repeated. The order of color can be different from this example.

Two subpixel rows adjacent to each other are disposed at different positions along the X-axis (when seen along the Y-axis). That is to say, each subpixel of a subpixel row is located between subpixels adjacent to each other in the next subpixel row, when seen along the Y-axis. In the example of FIG. 4, each subpixel row is shifted by a half pitch with respect to the next subpixel row. One pitch is a distance between the centroids of subpixels adjacent to each other in a subpixel row. A subpixel included in the first subpixel row is located at the middle between two subpixels adjacent to each other included in the subpixel row next to the first subpixel row.

The display region 125 includes a plurality of subpixel columns extending along the Y-axis and disposed side by side along the X-axis. In FIG. 4, two subpixel columns are provided with reference signs 42A and 42B. A subpixel column is composed of subpixels disposed along the Y-axis.

Each subpixel column is composed of red subpixels 41R, green subpixels 41G, and blue subpixels 41B cyclically disposed at a predetermined pitch. In the example of FIG. 4, a red subpixel 41R, a blue subpixel 41B, and a green subpixel 41G are disposed in this order and this cycle is repeated in the Y-direction (the direction from the top to the bottom in FIG. 4). The order of color can be different from this example.

Two subpixel columns adjacent to each other are disposed at different positions along the Y-axis (when seen along the X-axis); each subpixel included in the first subpixel column is located between subpixels of the other two colors included in the subpixel column next to the first subpixel column. In the example of FIG. 4, each subpixel column is shifted by a half pitch with respect to the next subpixel column. One pitch is a distance along the Y-axis between the centroids of subpixels of the same color. For example, a green subpixel 41G is located at the middle between a red subpixel 41R and a blue subpixel 41B of the next subpixel column, when seen along the X-axis.

In the delta-nabla arrangement illustrated in FIG. 4, the luminance centers of the subpixels are equally distant from one another to achieve real resolution display. In this embodiment, a subpixel line extending along the X-axis is referred to as subpixel row and a subpixel line extending along the Y-axis is referred to as subpixel column for descriptive purposes; however, the orientations of the subpixel rows and the subpixel columns are not limited to these.

Application Separation Openings

Figure 5:
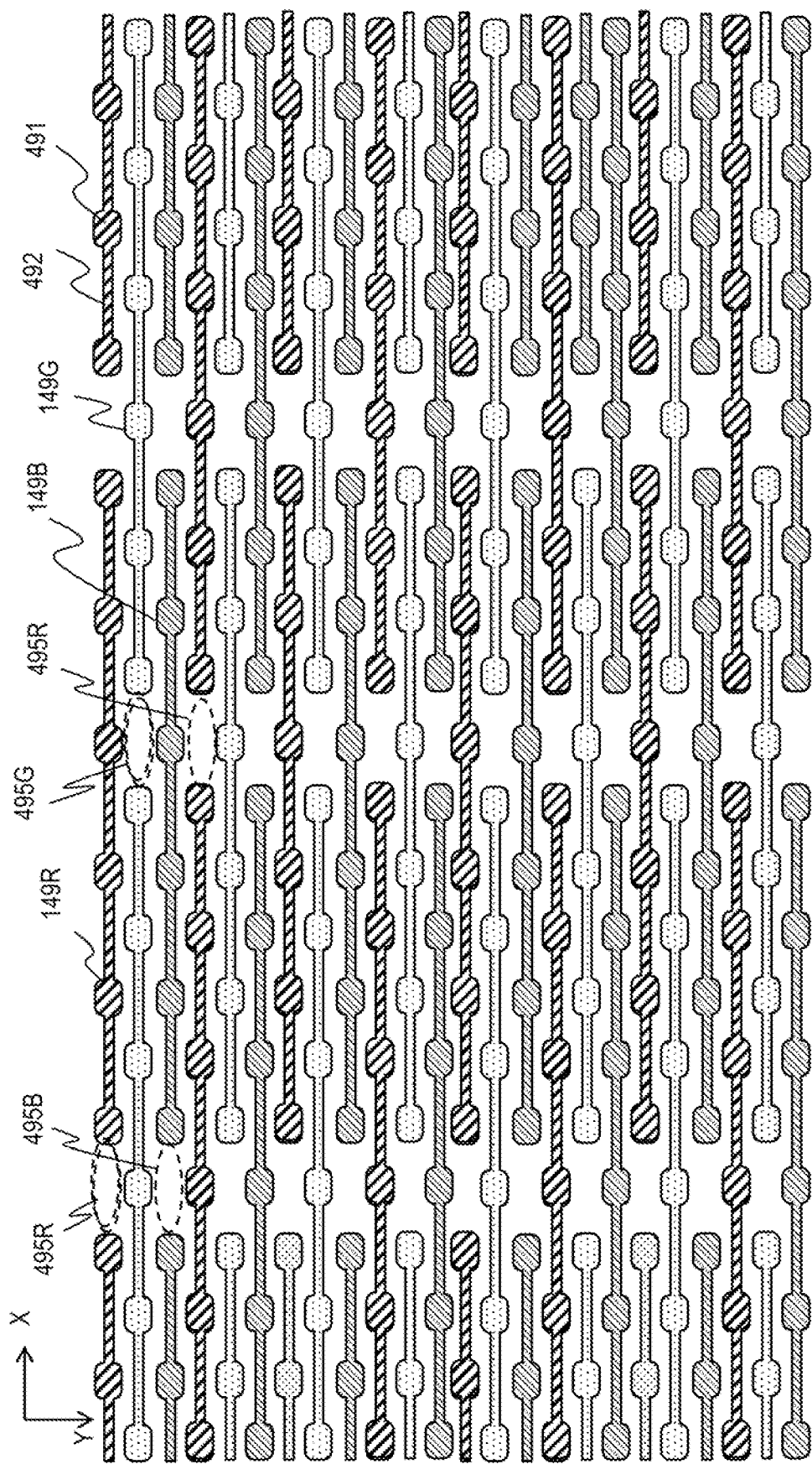
FIG. 5 illustrates an example of the pattern of application separating openings of an applied-material separation layer.

FIG. 5 illustrates an example of the pattern of application separation openings of the applied-material separation layer 164. In FIG. 5, one of the application separation openings (red application separation openings) for including a plurality of red subpixels (when seen along the normal to the substrate 100) is provided with a reference sign 149R; one of the application separation openings (green application separation openings) for including a plurality of green subpixels is provided with a reference sign 149G; and one of the application separation openings (blue application separation openings) for including a plurality of blue subpixels is provided with a reference sign 149B, by way of example. The application separation openings identically hatched in FIG. 5 represent application separation openings for the same color of subpixels.

A plurality of the same color of subpixels are included in each application separation opening. In the example of FIG. 5, the same color of subpixels in an application separation opening is included in the same subpixel row. Each red application separation opening 149R includes six red subpixels consecutive in a red subpixel row. Each green application separation opening 149G includes six green subpixels consecutive in a green subpixel row. Each blue application separation opening 149B includes six blue subpixels consecutive in a blue subpixel row.

In the example of FIG. 5, the shapes of the application separation openings 149R, 149G, and 149B are identical. Each application separation opening includes regions (subpixel regions) for including a subpixel (PDL opening) and regions (connection regions) for connecting these subpixel regions. The subpixels are located in the subpixel regions. In FIG. 5, one of the subpixel regions of one red application separation opening 149R is provided with a reference sign 491 and one of the connection regions of the same red application separation opening 149R is provided with a reference sign 492, by way of example. Each application separation opening in the example of FIG. 5 consists of six subpixel regions and five connection regions each connecting subpixel regions adjacent to each other.

In each subpixel row, a bank is provided between application separation openings adjacent to each other. In FIG. 5, two banks (surrounded by a broken line) between adjacent red application separation openings 149R in different red subpixel rows are provided with a reference sign 495R by way of example; one bank (surrounded by a broken line) between adjacent green application separation openings 149G in a green subpixel row is provided with a reference sign 495G by way of example; and one bank (surrounded by a broken line) between adjacent blue application separation openings 149B in a blue subpixel row is provided with a reference sign 495B by way of example.

As illustrated in FIG. 5, the banks (confines) between adjacent application separation openings in subpixel rows for different colors adjacent to each other are disposed at different positions (in a staggered arrangement) when seen along the Y-axis. This arrangement makes it difficult to perceive the unevenness of luminance at the ends of the application separation openings within the display region 125. This feature will be described later in detail.

Specifically, the banks 495R in a red subpixel row are shifted from the banks 495G in the adjacent green subpixel row when seen along the Y-axis and further, shifted from the banks 495B in the adjacent blue subpixel row when seen along the Y-axis. In similar, the banks 495G in a green subpixel row are shifted from the banks 495R in the adjacent red subpixel row when seen along the Y-axis and further, shifted from the banks 495B in the adjacent blue subpixel row when seen along the Y-axis.

The shift amount between the banks in adjacent subpixel rows for different colors is determined by design. In an example, the centers of the banks between application separation openings in adjacent subpixel rows for different colors are distant by a subpixel pitch (the distance between the centroids of subpixels) or more along the X-axis for the purpose to make it difficult to perceive the unevenness of luminance. In the example of FIG. 5, the centers of the banks between application separation openings in adjacent subpixel rows are distant by 3.5 times or 2.5 times of a subpixel pitch along the X-axis. Since each application separation opening is formed to include six subpixels, the distance between banks in adjacent subpixel rows can be made long.

Further in the example of FIG. 5, the banks (confines) between adjacent application separation openings in subpixel lines for the same color adjacent to each other are disposed at different positions (in a staggered arrangement) when seen along the Y-axis. This arrangement makes it more difficult to perceive the unevenness of luminance at the ends of the application separation openings within the display region 125. Since the red subpixel rows, the green subpixel rows, and the blue subpixel rows are disposed cyclically along the Y-axis, subpixel lines for two different colors are sandwiched by subpixel lines for the same color.

The shift amount between the banks in adjacent subpixel rows for the same color is determined by design. In an example, the centers of the banks between application separation openings in adjacent subpixel rows for the same color are distant by a subpixel pitch or more along the X-axis for the purpose to make it difficult to perceive the unevenness of luminance. In the example of FIG. 5, the centers of the banks between application separation openings in adjacent subpixel rows for the same color are distant by 3.5 times or 2.5 times of a subpixel pitch along the X-axis.

The shapes of the application separation openings for different colors of subpixels can be different. The shapes of the application separation openings for the same color of subpixels can also be different. For example, the numbers of included subpixels per application separation opening can be different among the red application separation openings 149R, the green application separation openings 149G, and the blue application separation openings 149B.

Figure 6:
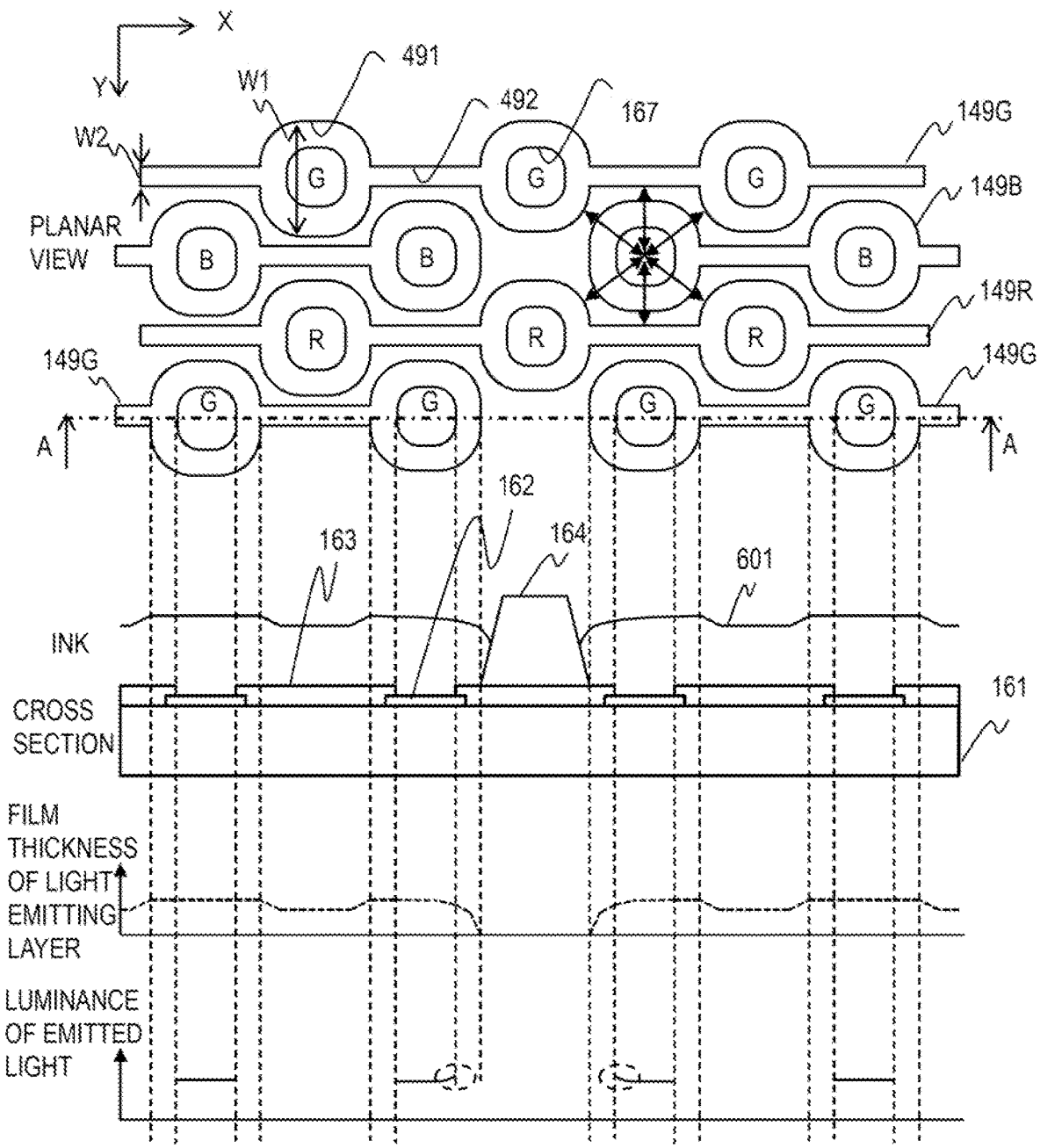
FIG. 6 is a diagram illustrating unevenness of luminance of subpixels in an application separation opening and a configuration to make it difficult to perceive the unevenness of luminance.

FIG. 6 is a diagram illustrating the unevenness of luminance of subpixels in an application separation opening and a configuration to make it difficult to perceive the unevenness of luminance. FIG. 6 schematically illustrates a plan view of application separation openings 149 of the applied-material separation layer 164 and PDL openings 167 of the pixel defining layer 163, a cross-section of a part of the OLED panel cut along the line A-A in the plan view, the film thickness of the organic light-emitting films (light-emitting layer) 165, and the luminance of subpixels.

The entirety of a PDL opening 167 is included in a subpixel region 491 of an application separation opening 149. The width (the largest value of the dimension along the Y-axis) W2 of a connection region 492 connecting subpixel regions 491 is smaller than the width (the largest value of the dimension along the Y-axis) W1 of a subpixel region 491. The subpixel regions 491 in a subpixel row (an application separation opening row) are shifted from the subpixel regions 491 in the adjacent subpixel row when seen along the Y-axis. Since the width W2 of the connection regions 492 is smaller than the width W1 of the subpixel regions 491, the connection regions 492 can be appropriately separated from application separation openings 149 of the adjacent rows.

As described above, the OLED display device manufacturing method applies organic EL ink 601 to the inside of each application separation opening 149. In an example, the manufacturing method ejects droplets to each subpixel region 491 (each PDL opening 167). As illustrated in FIG. 6, the distance between subpixels of different colors in delta-nabla arrangement is larger than the same in different pixel arrangements such as RGB stripe arrangement. Accordingly, the risk of color mixture can be lowered.

The organic EL ink 601 injected in a subpixel region 491 spreads within the entire application separation opening 149 via connection regions 492. Since the wettability of the pixel defining layer 163 is high and the wettability of the applied-material separation layer 164 is low as described above, the organic EL ink 601 appropriately spreads over on the anode electrodes 162 within the application separation opening 149.

Since a plurality of pixels are included in one application separation opening 149, the variation in film thickness of the organic light-emitting film caused by variation in the amount of ink ejected from the head is reduced. Furthermore, dividing each color of subpixels to a plurality of application separation openings 149 reduces the variation in film thickness among organic light-emitting films generated when the organic EL ink dries.

The organic EL ink 601 dries within an application separation opening 149 to become organic light-emitting films 165. An unseparated organic light-emitting film is formed in the application separation opening 149; the organic light-emitting film 165 of a subpixel is a part of the unseparated organic light-emitting film in the application separation opening 149. The organic light-emitting film 165 of each subpixel is connected by the organic light-emitting film of the same material in the connection regions.

Frequently, the film thickness of an organic light-emitting film is different at both ends of an application separation opening 149 as illustrated in FIG. 6. For this reason, the luminance of the subpixels at both ends in an application separation opening 149 tends to be higher than the luminance of the inner subpixels. As described above, the application separation openings 149 are staggered, which makes it difficult to perceive the difference in luminance at both ends of each application separation opening 149.

Figure 7:
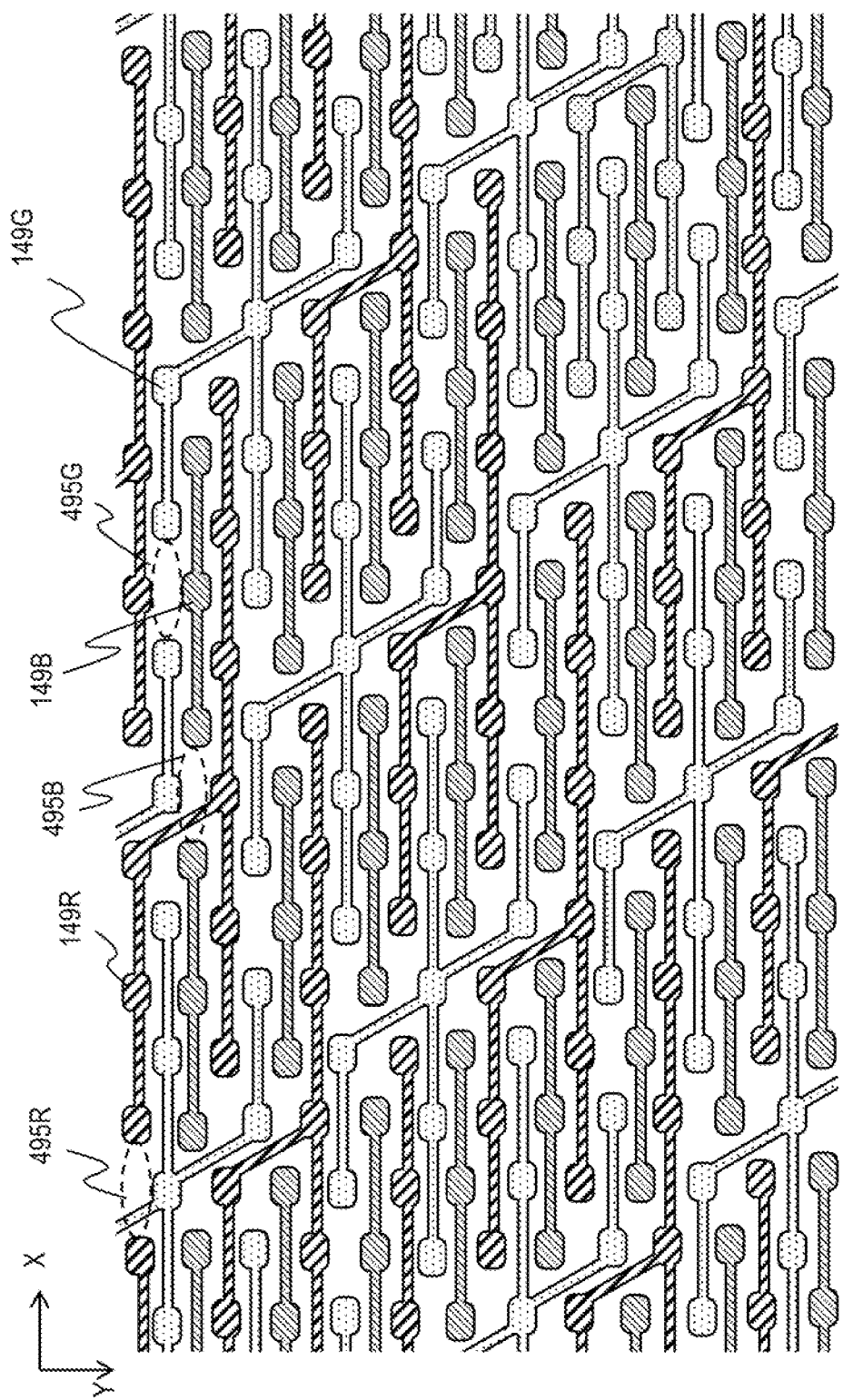
FIG. 7 illustrates another example of a pattern of application separating openings of an applied-material separation layer.

FIG. 7 illustrates another example of a pattern of application separation openings of the applied-material separation layer 164. The subpixel arrangement is a delta-nabla arrangement like the example illustrated in FIG. 5. The pattern of application separation openings in this example includes an application separation opening to include subpixels in a plurality of subpixel rows. Including subpixels in different subpixel rows in one application separation opening leads to reduction in variation in film thickness among organic light emitting films caused by variation in the amount of ink ejected from different heads and further, variation in the amount of ink ejected from the same head.

In FIG. 7, one of the red application separation openings, one of the green application separation openings, and one of the blue application separation openings are provided with reference signs 149R, 149G, and 149B, respectively, by way of example. The application separation openings identically hatched in FIG. 7 represent application separation openings for the same color of subpixels. A plurality of subpixels of the same color are provided in each application separation opening. Each application separation opening includes subpixel regions and connection regions connecting the subpixel regions and the width of the connection regions is smaller than the width of the subpixel regions. Each subpixel (PDL opening) is located within a subpixel region.

In the example of FIG. 7, the number of subpixels included in each red application separation opening 149R is the same and the shapes of the subpixels are identical. A red application separation opening 149R includes subpixels in two adjacent red subpixel rows. Specifically, a red application separation opening 149R includes six subpixels consecutive in one red subpixel row and three subpixels consecutive in the adjacent red subpixel row.

The number of subpixels included in each green application separation opening 149G is the same and the shapes of the subpixels are identical. A green application separation opening 149G includes subpixels in three adjacent green subpixel rows. Specifically, a green application separation opening 149G includes two subpixels consecutive in one green subpixel row, two subpixels consecutive in another green subpixel row, and five subpixels consecutive in the green subpixel row sandwiched by these green subpixel rows.

The number of subpixels included in each blue application separation opening 149B is the same and the shapes of the subpixels are identical. A blue application separation opening 149B includes subpixels in one blue subpixel row. Specifically, a blue application separation opening 149B includes three subpixels consecutive in one blue subpixel row.

In FIG. 7, a bank (confine) in a red subpixel row, a bank in a green subpixel row, and a bank in a blue subpixel row are surrounded by broken lines and provided with reference signs 495R, 495G, and 495B, respectively, by way of example. Like in the configuration example of FIG. 5, the banks (confines) between adjacent application separation openings in subpixel lines for different colors adjacent to each other are disposed at different positions (in a staggered arrangement) when seen along the Y-axis. This arrangement makes it difficult to perceive the unevenness of luminance at the ends of the application separation openings within the display region 125.

Furthermore, the banks (confines) between adjacent application separation openings in subpixel lines for the same color adjacent to each other are disposed at different positions (in a staggered arrangement) when seen along the Y-axis. This arrangement makes it more difficult to perceive the unevenness of luminance at the ends of the application separation openings within the display region 125.

In the example of FIG. 7, the green application separation openings 149G include the largest number of subpixels and the blue application separation openings 149B include the smallest number of subpixels. The relative luminance of green is the highest and the relative luminance of blue is the lowest; the variation in luminance among subpixels can be reduced by including a larger number of subpixels in an application separation opening. Accordingly, including the largest number of subpixels in a green application separation opening 149G and including the smallest number of subpixels in a blue application separation opening 149B lead to reduction of the variation in luminance to be perceived. The number of subpixels included in a red application separation opening 149R is equal to or smaller than the number of subpixels included in a green application separation opening 149G and equal to or larger than the number of subpixels included in a blue application separation opening 149B.

The number of subpixels to be included in each application separation opening 149 is determined by design and is not limited by the above-described configuration example. The application separation openings for the same color of subpixels can have different shapes and can include different numbers of subpixels.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. An OLED display device, comprising:
    a substrate;
    a plurality of subpixel lines on the substrate, each of the plurality of subpixel lines including a plurality of subpixels of the same color disposed along a first axis; and
    an applied-material separation layer on the substrate, the applied-material separation layer having a plurality of application separation openings,
    wherein each of the plurality of application separation openings includes a plurality of subpixels of the same color that are consecutive in one subpixel line,
    wherein, within each application separation opening, organic light-emitting films of the plurality of subpixels of the same color are connected by an organic light-emitting film made of the same material as material of the organic light-emitting films of the subpixels, and
    wherein banks between application separation openings in each of the plurality of subpixel lines are different in position from banks between application separation openings in an adjacent subpixel line when seen along a second axis perpendicular to the first axis,
    wherein the plurality of subpixel lines are composed of red subpixel lines, blue subpixel lines, and green subpixel lines cyclically disposed along the second axis,
    wherein each of subpixels in each subpixel line of the plurality of subpixel lines is different in position along the first axis with respect to each of subpixels in each of subpixel lines of the plurality of subpixel lines adjacent thereto, and
    wherein banks between application separation openings in each of the plurality of subpixel lines are different in position from banks between application separation openings in an adjacent subpixel line of subpixels of the same color when seen along the second axis.

2. The OLED display device according to claim 1, wherein a dimension along the second axis of a region connecting subpixels of each application separation opening is smaller than a dimension along the second axis of a region including a subpixel of each application separation opening.

3. The OLED display device according to claim 2, wherein banks in one of two subpixel lines of subpixels of the same color adjacent to each other in the plurality of subpixel lines are different in position from banks in the other subpixel line by a distance between subpixels in the subpixel lines or more than a distance between subpixels in the subpixel lines when seen along the second axis.

4. The OLED display device according to claim 1, wherein all subpixels included in each of the plurality of application separation openings are included in the same subpixel line.

5. The OLED display device according to claim 1, wherein a number of included subpixels is the same among application separation openings including subpixels of the same color in the plurality of application separation openings.

6. The OLED display device according to claim 1, wherein banks in one of two subpixel lines adjacent to each other in the plurality of subpixel lines are different in position from banks in the other subpixel line by a distance between subpixels in the subpixel lines or more than a distance between subpixels in the subpixel lines when seen along the second axis.

7. The OLED display device according to claim 1, wherein each one of at least a part of the plurality of application separation openings includes subpixels of the same color in different subpixel lines.

8. The OLED display device according to claim 1,
    wherein each of the plurality of subpixel lines is one of a red subpixel line, a blue subpixel line, and a green subpixel line, and
    wherein each of application separation openings including subpixels of a specific color in the plurality of application separation openings includes subpixels of the specific color in different subpixel lines.

9. The OLED display device according to claim 8, wherein, among the plurality of application separation openings, a number of included blue subpixels per application separation opening is smaller than a number of included green subpixels per application separation opening.

* * * * *